(12) United States Patent
Hwang et al.

(10) Patent No.: US 6,656,284 B1
(45) Date of Patent: Dec. 2, 2003

(54) SEMICONDUCTOR DEVICE MANUFACTURING APPARATUS HAVING ROTATABLE GAS INJECTOR AND THIN FILM DEPOSITION METHOD USING THE SAME

(75) Inventors: Chul Ju Hwang, Songnam-shi (KR); Kyung Sik Shim, Songnam-shi (KR); Chang Soo Park, Seoul (KR)

(73) Assignee: Jusung Engineering Co., Ltd. (KR)

( * ) Notice: Subject to any disclaimer, the term of this patent is extended or adjusted under 35 U.S.C. 154(b) by 0 days.

(21) Appl. No.: 10/187,090

(22) Filed: Jun. 28, 2002

(51) Int. Cl.[7] .................. H01L 21/30; B65G 49/07; C23C 16/00
(52) U.S. Cl. .......... 118/715; 438/622; 438/623; 438/780; 438/781; 438/790; 438/782; 427/240; 427/255.3; 427/255.2; 118/503; 118/723 E; 118/730; 118/724; 428/131
(58) Field of Search .................. 438/680, 782, 438/622, 623, 758, 759, 760, 761, 778, 780, 781, 790; 427/240, 255.3, 255.2; 118/503, 715, 723 E, 730, 724; 428/131; 257/744, 746

(56) References Cited

U.S. PATENT DOCUMENTS

| | | | | |
|---|---|---|---|---|
| 5,453,124 A | | 9/1995 | Moslehi et al. | 118/715 |
| 5,503,875 A | * | 4/1996 | Imai et al. | 427/255.39 |
| 5,783,023 A | | 7/1998 | Oh et al. | 156/345 |
| 6,086,976 A | * | 7/2000 | Gardner et al. | 428/131 |
| 6,238,815 B1 | * | 5/2001 | Skala et al. | 429/17 |
| 6,321,680 B2 | * | 11/2001 | Cook et al. | 118/723 E |
| 6,352,593 B1 | * | 3/2002 | Brors et al. | 118/724 |
| 6,352,594 B2 | * | 3/2002 | Cook et al. | 118/724 |
| 6,407,009 B1 | * | 6/2002 | You et al. | 438/782 |
| 6,413,884 B1 | * | 7/2002 | Moriyama | 438/784 |

FOREIGN PATENT DOCUMENTS

JP          05029233 A  *  2/1993  .......... H01L/21/205

* cited by examiner

*Primary Examiner*—Matthew Smith
*Assistant Examiner*—V. Yevsikov
(74) *Attorney, Agent, or Firm*—Marger Johnson & McCollom, P.C.

(57) ABSTRACT

Disclosed is a semiconductor device manufacturing apparatus provided with a rotational gas injector for supplying source gases at an upper portion of a reaction chamber. According to the invention, source gases are injected from the upside of the wafers through the rotational type gas injector, and non-reacted gases are exhausted into the downside space of the wafers, so that lowering in the thickness uniformity of a thin film due to the horizontal flow of source gases provided in the conventional art decrease remarkably. Accordingly, although multiple wafers are loaded in a single reaction chamber, a thin film having very high thickness uniformity can be deposited with respect to all the wafers, thereby capable of enhancing the productivity.

11 Claims, 5 Drawing Sheets

SEMICONDUCTOR DEVICE MANUFACTURING APPARATUS HAVING ROTATABLE GAS INJECTOR AND THIN FILM DEPOSITION METHOD USING THE SAME

BACKGROUND OF THE INVENTION

1. Field of the Invention

The present invention relates to a semiconductor device manufacturing apparatus and a thin film deposition method using the same, and more particularly, to a semiconductor device manufacturing apparatus in which a rotational gas injector is provided to permit deposition of a thin film having a very high uniformity, and a thin film deposition method using the same.

2. Description of the Related Art

As the wafer size increases, it becomes difficult to deposit thin films at a uniform thickness. When several wafers are loaded in a single reaction chamber to deposit a thin film on these wafers, it is very difficult to allow the thin films deposited on all of the wafers to have the same thickness. This is because source gases are not uniformly distributed within the reaction chamber.

Although the above deposition method in which several wafers are loaded in the single reaction chamber and the thin films are simultaneously deposited on the loaded wafers, increases the production yield, this trial is being hoarded owing to the above reason.

FIG. 1 is a schematic view for illustrating a semiconductor device manufacturing apparatus in accordance with the conventional art. Referring to FIG. 1, a reaction space shielded from the outside is formed in a reaction chamber 100 including a lower chamber 110a and an upper chamber 110b. Source gases for forming a thin film are supplied onto a wafer 130 loaded in the reaction chamber 100 through a gas supply inlet 140 formed at a side portion of the reaction chamber 100 with a horizontal flow, and are exhausted through a gas-exhausting outlet 150 formed at a side portion of the reaction chamber 100.

When a semiconductor process of a chemical vapor deposition (CVD) is carried out using the aforementioned semiconductor device manufacturing apparatus, source gases horizontally flow and pass through the wafer 130. To this end, amount of gases adsorbed on the surface of the wafer 130 near the gas supply inlet 140 becomes different from that adsorbed on the surface of the wafer 130 near the gas-exhausting outlet opposite to the gas supply inlet, so that thickness of a thin film deposited on the wafer 130 becomes non-uniform. This phenomenon becomes more conspicuous as the wafer size increases. Also, since the thin film deposition is performed by the horizontal flow of the source gases, adsorption rate of the source gases to the wafer 130 is lowered, so that deposition rate of the thin film is also lowered.

For mass production, in case that multiple wafers are loaded in the reaction chamber 100, the thin film is non-uniformly deposited with respect to the plural wafers as well as one wafer. Moreover, in order to load several sheets of wafers into the reaction chamber 100, it is requested to increase the volume of the reaction chamber 100, so that the aforementioned non-uniformity problem becomes more seriously conspicuous.

SUMMARY OF THE INVENTION

Accordingly, the present invention has been devised to solve the foregoing problems and it is an object of the present invention to provide a semiconductor device manufacturing apparatus provided with a rotational gas injector, thereby capable of allowing a deposition of a thin film having avery high uniformity.

It is another object of the invention to provide a method for depositing a thin film having a high uniformity using a semiconductor device manufacturing apparatus obtained by accomplishing the above object.

To accomplish the object and other advantages, there is provided a semiconductor device manufacturing apparatus comprising: a reaction chamber provided with a gas-exhausting outlet for exhausting an inner gas; a susceptor supporting die horizontally arranged within the reaction chamber; at least one susceptor installed on the susceptor supporting die, on which a wafer is mounted; a cylinder vertically coupled to an upper outer wall of the reaction chamber, the cylinder having a plurality of ring-shaped grooves formed along an inner wall thereof, each of the ring-shaped grooves being connected to a plurality of gas injection holes formed so as to penetrate a side wall of the cylinder; a rotational shaft closely contacted with the inner wall of the cylinder, rotatably inserted in the cylinder, vertically inserted within the reaction chamber, having multiple gas supply tubes arranged parallel to a length direction thereof, one end of each of the gas supply tubes communicating with the ring-shaped groove; and a propeller type gas injector having horizontally radially branched tubes connected with the gas supply tubes at an insertion end of the rotational shaft, the branched tubes each having multiple injection holes, the propeller type gas injector being horizontally rotated by a rotational movement of the rotational shaft.

Here, the gas-exhausting outlet is preferably formed in the reaction chamber so as to be disposed below the susceptor.

The injection hole is preferably directed toward a direction between a lower direction of the branched tubes and a rotational direction of the propeller type gas injector.

Preferably, the above apparatus further includes a water-cooling tube equipped in the wall of the cylinder, and heating means installed within the susceptor-supporting die.

Also, the susceptor supporting die is preferably installed so as to be horizontally rotatable and movable upward and downward.

The propeller type gas injector is preferably made of metal, and is electrically connected with an RF power supply source. The rotational shaft and the cylinder are closely contacted with each other through a magnetic sealing. The susceptor-supporting die has at least one penetration hole connected with the gas-exhausting outlet at a place where the susceptor is not positioned.

According to another aspect of the invention, there is provided a thin film deposition method using the above apparatus. The method includes the steps of: mounting a wafer on the susceptor; and rotating the rotational shaft while injecting a gas through the multiple gas injection holes.

BRIEF DESCRIPTION OF THE DRAWINGS

The above object and other advantages of the present invention will become more apparent by describing in detail preferred embodiments thereof with reference to the accompanying drawings in which.

DETAILED DESCRIPTION OF THE PREFERRED EMBODIMENT

Hereinafter, there are specifically described preferred embodiments of the present invention with reference to the accompanying drawings.

Figure 3:
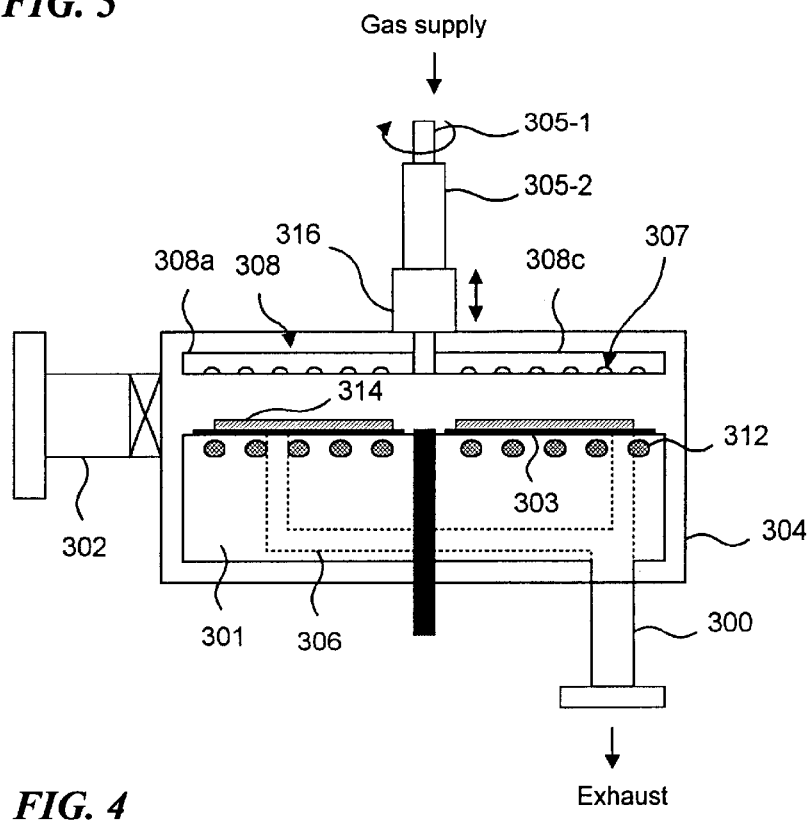
FIGS. 3 to 8 are schematic views for illustrating a semiconductor device manufacturing apparatus in accordance with preferred embodiments of the present invention.
Figure 4:
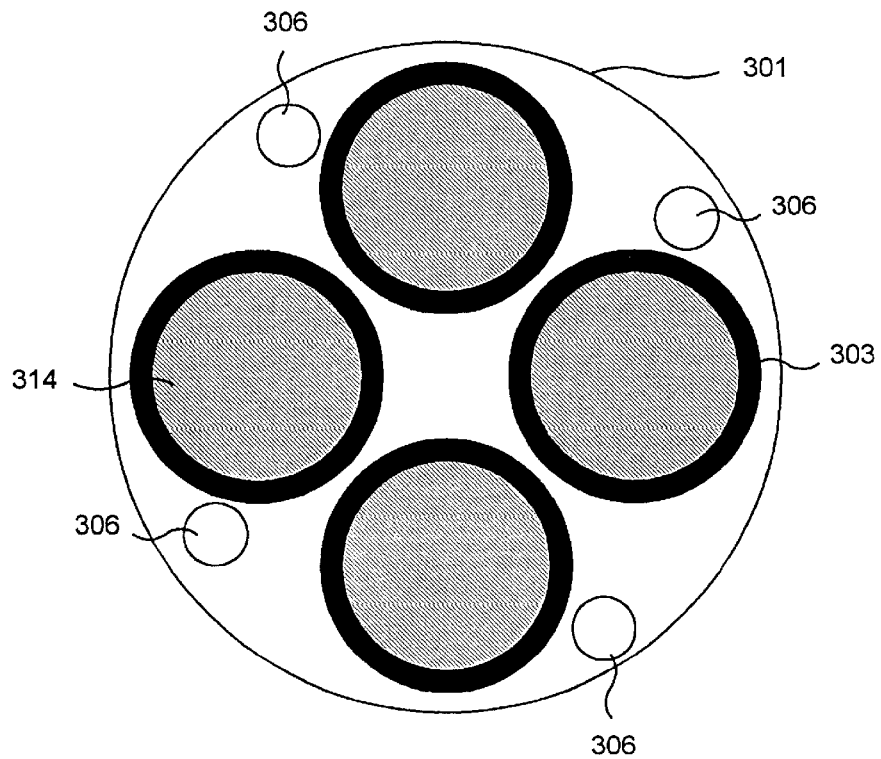

FIG. 3 is a sectional view for illustrating a semiconductor device manufacturing apparatus in accordance with one preferred embodiment. Referring to FIG. 3, a reaction chamber 304 is provided with a gas-exhausting outlet 300 for exhausting inner gas. As shown in FIG. 4, four susceptors 303 are arranged on a susceptor-supporting die 301, and four wafers 314 are respectively mounted on the respective susceptors 303. The susceptor-supporting die 301 has at least one penetration hole 306 connected with the gas-exhausting outlet 300 at a portion where the susceptors 303 are not placed.

Figure 7:
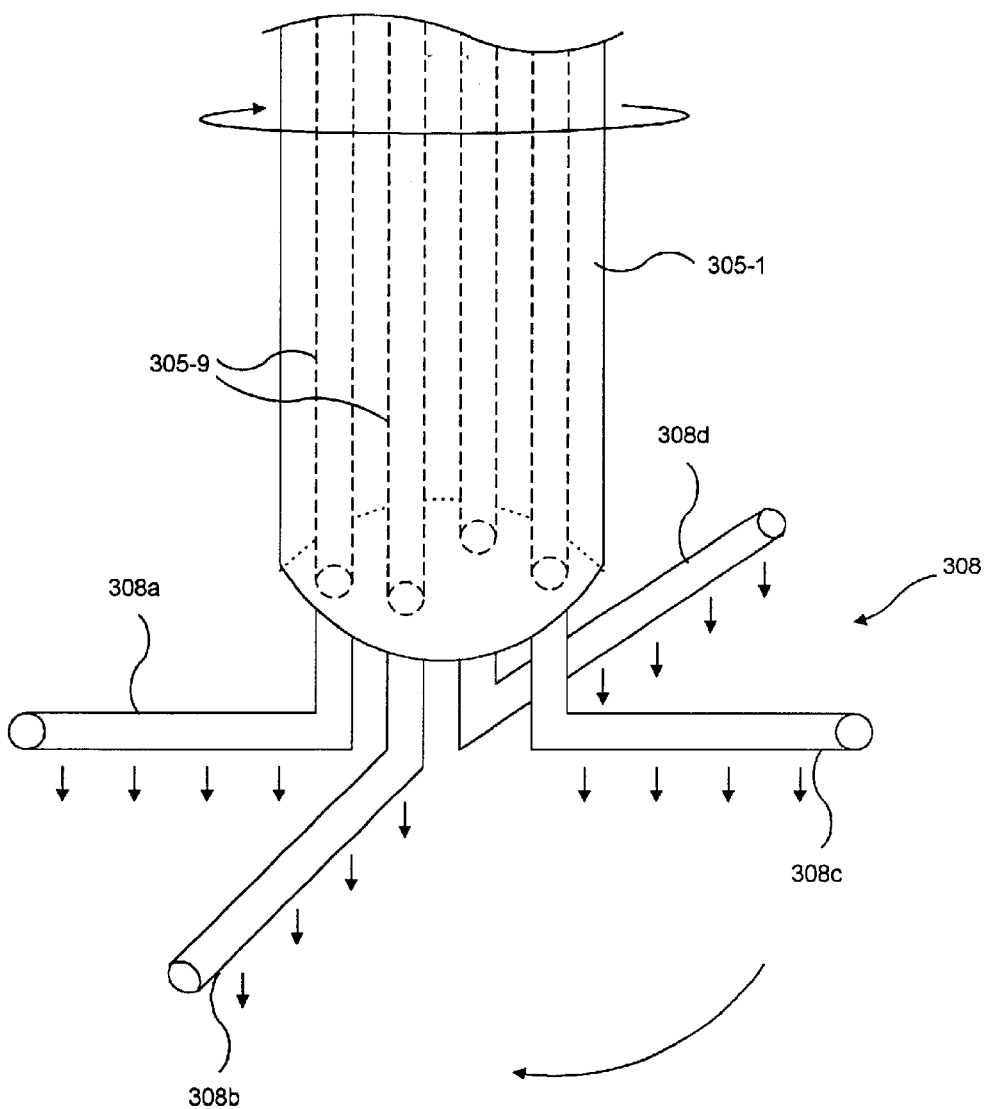
Figure 8:
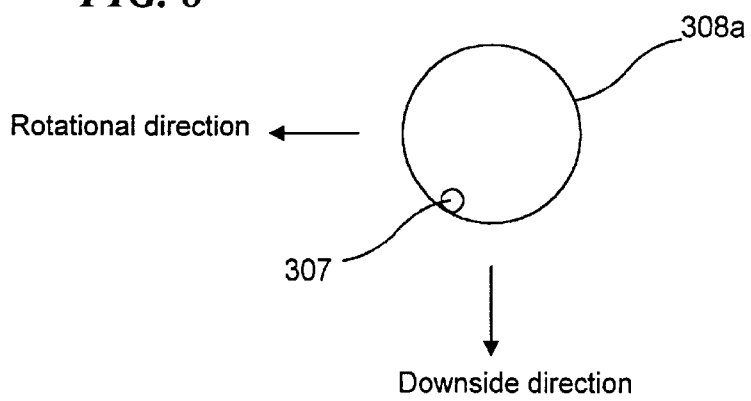

On the reaction chamber 304 is disposed a rotational gas injector including a cylinder 305-2, a rotational shaft 305-1 and a propeller type gas injector (308 in FIG. 7). During the manufacturing process of a semiconductor device, the propeller type gas injector (308 in FIG. 7) injects source gases into a reaction space while it rotates. Alternatively, the propeller type gas injector 308 may be replaced by adding a horizontal rotational function to the susceptor-supporting die 301. Also, since controlling a distance between the propeller type gas injector 308 and the susceptor 303 may be needed according to applied processes, the susceptor supporting die 301 and the rotational shaft 305-1 are installed so that they can move up and down.

Non-described reference numeral 302 represents a wafer loading part, and reference numeral 312 represents a heater arranged in a concentric circle configuration so as to heat the wafer 314.

Figure 5:
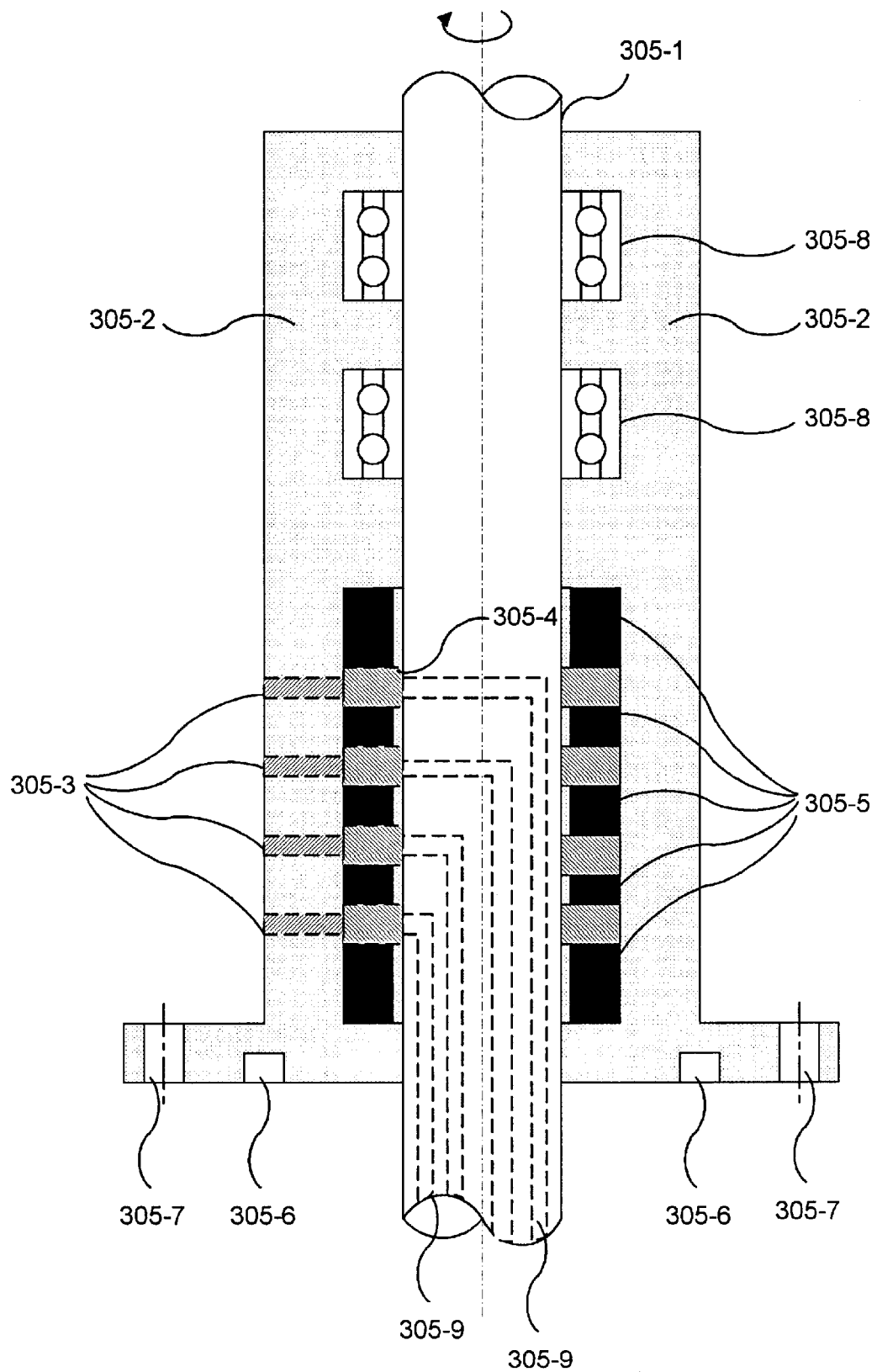
Figure 6:
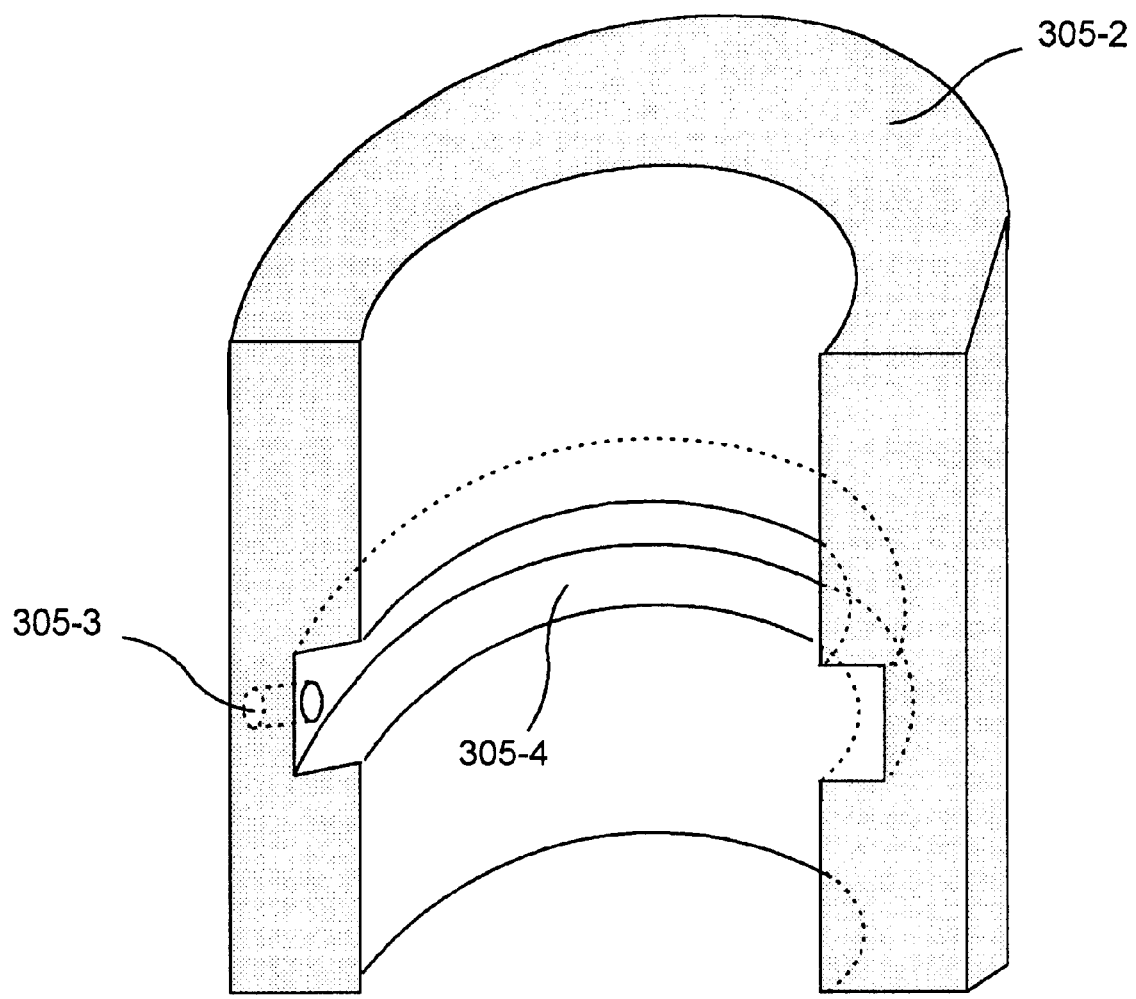

FIGS. 5 and 6 are schematic views for illustrating the cylinder 305-2 and the rotational shaft 305-1 shown in FIG. 3 in more detail.

Figure 1:
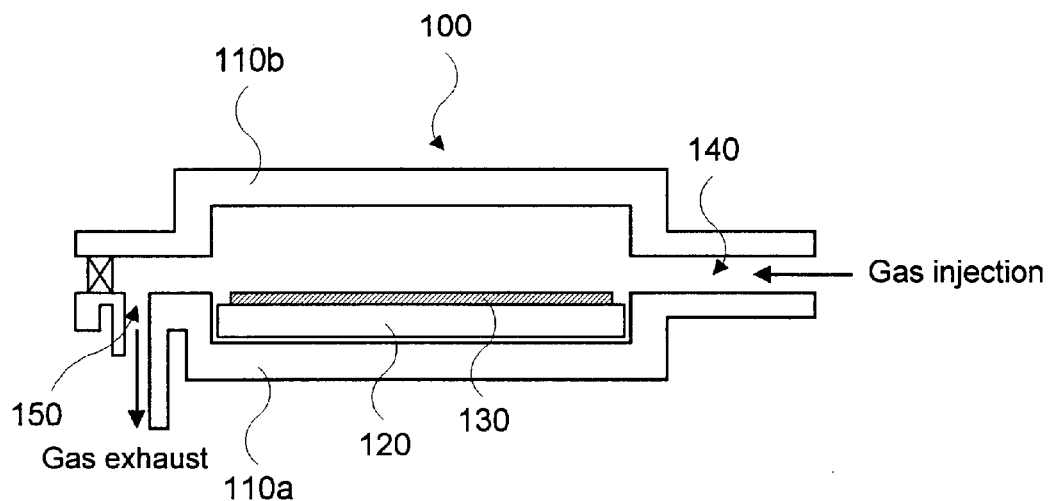
FIGS. 1 and 2 are schematic views for illustrating a semiconductor device manufacturing apparatus in accordance with the conventional art.
Figure 2:
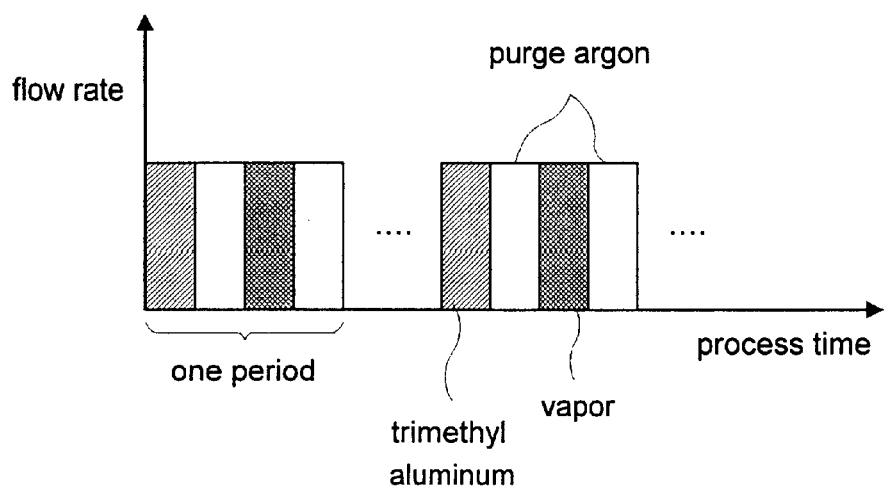

Referring to FIGS. 5 and 6 together with FIG. 1, the cylinder 305-2 is flange-coupled to an upper outer wall of the reaction chamber 304. A screwing hole 305-7 is used to screw-couple the reaction chamber 304 with the cylinder 305-2. An O-ring tube 305-6 into which an O-ring can be installed is provided in the cylinder 305-2 such that a leak does not occur at a portion closely contacted with the reaction chamber 304.

Four ring-shaped grooves 305-4 are formed along a circumference of an inner wall of the cylinder 305-2. Four gas injection holes 305-3 are formed in a sidewall of the cylinder 305-2. The four gas injection holes 305-3 penetrate the sidewall of the cylinder 305-2 and are respectively connected with the four ring-shaped grooves 305-4. FIG. 6 schematically shows one ring-shaped groove 305-4 and the gas injection hole 305-3 connected to the one ring-shaped groove 305-4.

The rotational shaft 305-1 is inserted into the inner wall of the cylinder 305-2, and thus it is vertically and inwardly inserted in the reaction chamber 304. A position controller 316 is installed around the inwardly inserted portion so as to control the inwardly inserted length of the rotational shaft 305-1. Four gas supply tubes 305-9 are formed inside the rotational shaft 305-1 along the length direction of the rotational shaft 305-1. The respective gas supply tubes 305-9 are installed such that one end thereof communicates with the ring-shaped grooves 305-4. The rotational shaft 305-1 is installed to be closely contacted with the cylinder 305-2 and be rotatable. For the rotational shaft 305-1 to rotate with ease, a bearing 305-8 is installed in the inner wall of the cylinder 305-2. The rotational shaft 305-1 and the cylinder 305-2 are closely contacted with each other through a magnetic sealing 305-2. In order to eliminate friction heat generated during the rotation of the rotational shaft 305-1, a water-cooling tube (not shown) is installed in the wall of the cylinder 305-2.

The gas injection holes 305-3, the ring-shaped grooves 305-4 and the gas supply tubes 305-9 have an identical number such that they correspond to each other one-to-one. If source gases are respectively introduced through the gas injection hole 305-3, the source gases are injected into the inside of the reaction chamber 304 through the propeller type gas injector (308 of FIG. 7) via the ring-shaped grooves 305-4 and the gas supply tubes 305-9 sequentially. Although the rotational shaft 305-1 rotates, the gases are smoothly supplied regardless of the rotation of the rotational shaft 305-1 since the four gas supply tubes 305-9 and the four ring-shaped groove are always in a communicated state to correspond to each other one-to-one.

FIG. 7 is a perspective view of the propeller type gas injector 308. The propeller type gas injector 308 has four branched tubes 308a, 308b, 308c, 308d, which are respective connected with the gas supply tubes 305-9 at the insertion end of the rotational shaft 305-1 and are horizontally and radially branched. Each of the branched tubes 308a, 308b, 308c, and 308d has a plurality of injection holes 307. For carrying out a plasma process, the propeller type gas injector 308 is made of metal, and it may be electrically connected with an RF power supply source.

The rotational movement of the rotational shaft 305-1 horizontally rotates the propeller type gas injector 308. The injection holes 307 may be formed at the bottom surfaces of the branched tubes 308a, 308b, 308c, 308d, but they are preferably formed to be directed toward a direction between a lower direction of the branched tubes 308a, 308b, 308c, 308d, and the rotational direction of the propeller type gas injector 308. This is because the latter allows source gases to be uniformly distributed in the reaction space upon considering the rotation of the propeller type gas injector 308.

Thin film deposition using the semiconductor device manufacturing apparatus of FIG. 3 is accomplished by mounting the wafers 314 on the respective susceptors 303, and rotating the rotational shaft 305-1 while injecting source gases into the reaction space through the four gas injection holes 305-3. The source gases supplied into the four gas injection holes 305-3 may be different, and a part of them may be the same. The source gases supplied into the four gas injection holes 305-3 pass through the ring-shaped grooves 305-4 corresponding to the gas injection holes 305-3, and the gas supply tubes 305-9 communicating with the gas injection holes 305-3, and are finally injected into the reaction space through the injection hole 307 of the propeller type gas injector 308.

When it is required to supply the same source gases into all the gas injection holes 305-3, there is no need to rotate the propeller type gas injector 308 intentionally. However, when it is required to supply different source gases into all the gas injection holes 305-3 so as to deposit a thin film through a chemical reaction of the source gases, it is necessary to rotate the propeller type gas injector 308.

For instance, when it is required to form a thin TiN film, the first and third branched tubes 308a and 308c shown in FIG. 7 are allowed to inject a vapor, which is heat-decomposed from a precusor of TDEAT (Tetrakis Diethylamido Titanium, Ti$[N(C_2H_5)_2]_4$), and the second and fourth branched tubes 308b and 308d are allowed to inject $NH_3$ gas while rotating the propeller type gas injector 308. Thus, the vapor of TDEAT and the $NH_3$ gas are uniformly distributed within the reaction space, so that thin TiN film is uniformly formed. Naturally, the thin TiN film is uniformly formed on the four wafers 314 by the source gases uniformly distributed within the reaction space. At this time, it is also natural to heat the wafers 314 such that a chemical reaction occurs on the surface of the wafers 314.

The penetration hole 306 of the susceptor-supporting die 301 is not always necessary. Although the penetration hole 306 does not exist, non-reacted gases are exhausted to the gas-exhausting outlet 300 through a gap between the susceptor supporting die 301 and the inner wall of the reaction chamber 304.

While the present embodiment mainly describes an operation way in which the gas injection tubes rotate, a similar effect can be obtained by an operation way in which the propeller type gas injector 308 is stopped and the susceptor supporting die 301 rotates. In this case, RF power is supplied into the propeller type gas injector 308 to activate the source gases in a plasma state.

The above structured semiconductor device manufacturing apparatus can be applied to a general CVD process and even to an atomic layer deposition (ALD) process if it is allowed to supply different gases through the branched tubes 308a, 308b, 308c, 308d of the gas injector 308.

As described previously, according to a semiconductor device manufacturing apparatus and a thin film deposition method using the same in accordance with the present invention, source gases are injected from the upside of the wafers 314 through the propeller type gas injector 308, and non-reacted gases are exhausted into the downside space of the wafers 314, so that lowering in the thickness uniformity of a thin film due to the horizontal flow of source gases provided in the conventional art decrease remarkably. Accordingly, although multiple wafers are loaded in a single reaction chamber, a thin film having very high thickness uniformity can be deposited with respect to all the wafers, thereby capable of enhancing the productivity.

Although the preferred embodiments of the present invention have been disclosed for illustrative purposes, those skilled in the art will appreciate that various modifications, additions and substitutions can be made without departing from the scope and spirit of the invention as disclosed in the accompanying claims.

What is claimed is:

1. A semiconductor device manufacturing apparatus comprising:

a reaction chamber provided with a gas-exhausting outlet for exhausting an inner gas;

a susceptor-supporting die horizontally arranged within the reaction chamber;

at least one susceptor installed on the susceptor-supporting die, on which a wafer is mounted;

a cylinder vertically coupled to an upper outer wall of the reaction chamber, the cylinder having a plurality of ring-shaped grooves formed along an inner wall thereof, each of the ring-shaped grooves being connected to a plurality of gas injection holes formed so as to penetrate a side wall of the cylinder;

a rotational shaft closely contacted with the inner wall of the cylinder, rotatably inserted in the cylinder, vertically inserted within the reaction chamber, having multiple gas supply tubes arranged parallel to a length direction thereof, one end of each of the gas supply tubes communicating with the ring-shaped groove; and a propeller type gas injector having horizontally radially branched tubes connected with the gas supply tubes at an insertion end of the rotational shaft, the branched tubes each having multiple injection holes, the propeller type gas injector being horizontally rotated by a rotational movement of the rotational shaft.

2. The apparatus as claimed in claim 1, wherein the gas-exhausting outlet is formed in the reaction chamber so as to be disposed below the susceptor.

3. The apparatus as claimed in claim 1, wherein the injection hole is directed toward a direction between a lower direction of the branched tubes and a rotational direction of the propeller type gas injector.

4. The apparatus as claimed in claim 1, further comprising a water-cooling tube equipped in the wall of the cylinder.

5. The apparatus as claimed in claim 1, wherein the propeller type gas injector is made of metal, and is installed so as to be connected with an RF power supply source.

6. The apparatus as claimed in claim 1, wherein the susceptor-supporting die is installed so as to be horizontally rotatable.

7. The apparatus as claimed in claim 1, wherein the susceptor supporting die is installed so as to be movable upward and downward.

8. The apparatus as claimed in claim 1, further comprising heating means installed within the susceptor-supporting die.

9. The apparatus as claimed in claim 1, wherein the rotational shaft and the cylinder are closely contacted with each other through a magnetic sealing.

10. The apparatus as claimed in claim 1, wherein the susceptor-supporting die has at least one penetration hole connected with the gas-exhausting outlet at a place where the susceptor is not positioned.

11. A thin film deposition method using the apparatus as claimed in claim 1, the method comprising the steps of:

mounting a wafer on the susceptor; and rotating the rotational shaft while injecting a gas through the multiple gas injection holes.

\* \* \* \* \*